United States Patent [19] [11] Patent Number: 5,946,178
Bijlenga [45] Date of Patent: Aug. 31, 1999

[54] PROTECTIVE CIRCUIT FOR SERIES-CONNECTED POWER SEMICONDUCTORS

[75] Inventor: Bo Bijlenga, Skultuna, Sweden

[73] Assignee: ABB Research Ltd., Västerås, Sweden

[21] Appl. No.: 08/894,737
[22] PCT Filed: Mar. 1, 1996
[86] PCT No.: PCT/SE96/00265
 § 371 Date: Oct. 27, 1997
 § 102(e) Date: Oct. 27, 1997
[87] PCT Pub. No.: WO96/27230
 PCT Pub. Date: Sep. 6, 1996

[30] Foreign Application Priority Data

Mar. 2, 1995 [SE] Sweden .................................. 9500761

[51] Int. Cl.⁶ .................................................. H02H 3/20
[52] U.S. Cl. ............................................. 361/91; 363/132
[58] Field of Search .................................. 361/91, 93, 56, 361/18; 363/132, 156, 137

[56] References Cited

U.S. PATENT DOCUMENTS

| 5,077,651 | 12/1991 | Kobayashi et al. | 363/56 |
| 5,465,190 | 11/1995 | Meunier et al. | 361/91 |
| 5,616,970 | 4/1997 | Dittrich | 307/126 |
| 5,650,906 | 7/1997 | Marquardt et al. | 361/88 |
| 5,737,200 | 4/1998 | Miyashita et al. | 363/56 |

FOREIGN PATENT DOCUMENTS

| 0 250 719 A2 | 7/1988 | European Pat. Off. . |
| 2 258 380 | 6/1974 | Germany . |
| 24 08 962 | 9/1975 | Germany . |
| 388 735 | 10/1976 | Sweden . |
| 8801140 | 3/1988 | Sweden . |

OTHER PUBLICATIONS

Chokhawala et al., Switching Voltage Transient Protection Schemes for High Current IGBT Modules, International Rectifier Corporation, Applications Engineering, El Segunda, CA, 1994, pp. 459–468.
Eschrich, Protection of IGBT Modules in Inverter Circuits, EPE Journal, vol. 1, No. 1, 1991, pp. 57–60.
Hefner, Jr., An Investigation of the Drive Circuit Requirements for the Power Insulated Gate Bipolar Transistor, (IGBT)*, IEEE Transactions on Power Electronics, vol. 6, No. 2, 1991, pp. 208–219.

Primary Examiner—Jeffrey Gaffin
Assistant Examiner—Kim Huynh
Attorney, Agent, or Firm—Pollock, Vande Sande & Priddy

[57] ABSTRACT

A semiconductor assembly with overvoltage protection is provided. The semiconductor assembly comprises at least two series connected power semiconductors, each of which is protected by at least one overvoltage protection device. The overvoltage protection device is activated at a predetermined voltage. The overvoltage protection device may be coupled in parallel across the emitter and collector of the power semiconductor or between the collector and gate of the power semiconductor. The overvoltage protection device includes a capacitor and a rectifier connected in series with the capacitor. The rectifier prevents the capacitor from discharging when the power semiconductor is in a conducting state. A voltage controller is connected to the capacitor and determines the voltage level to which the capacitor is discharged after an activation of the overvoltage protection device.

21 Claims, 11 Drawing Sheets

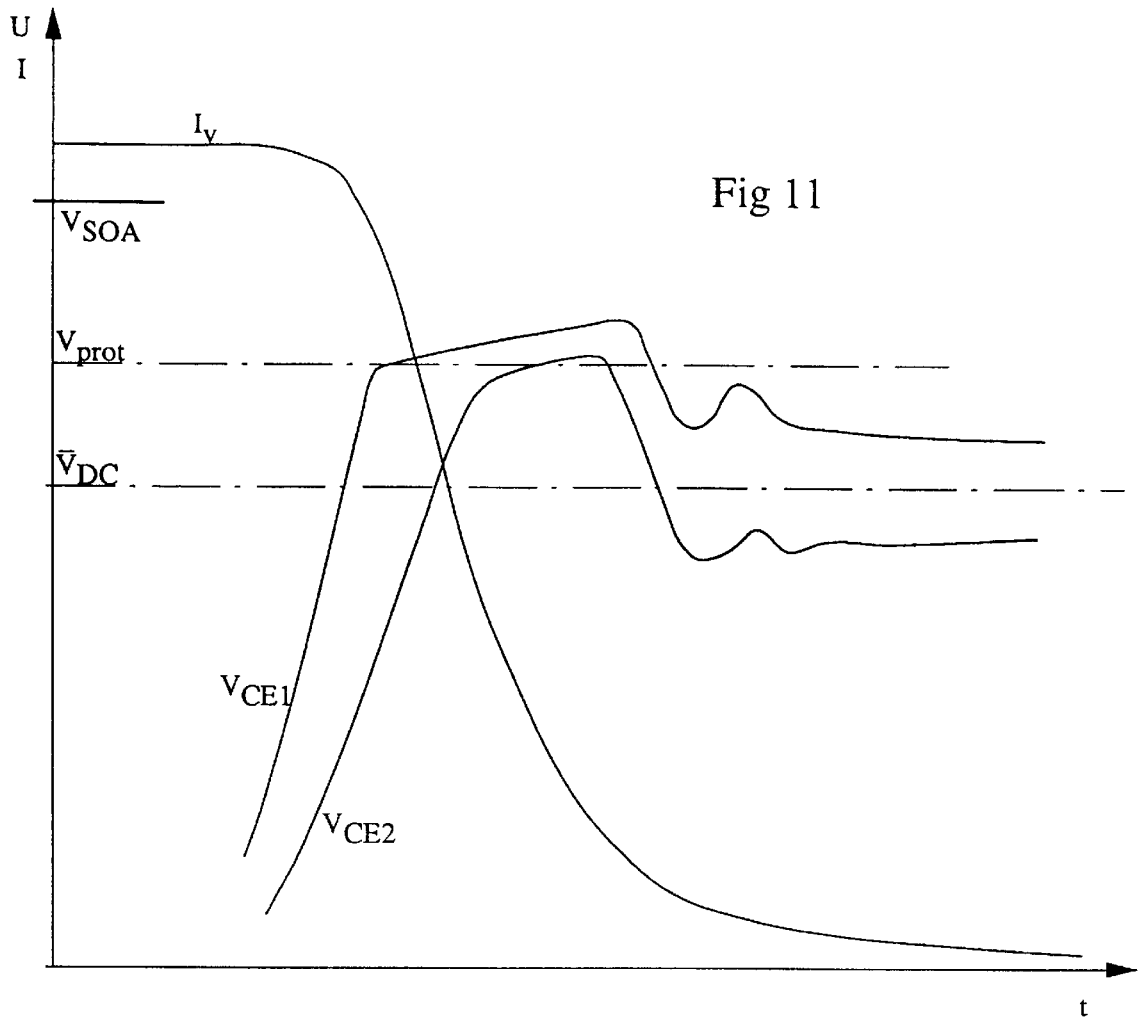
Fig 11
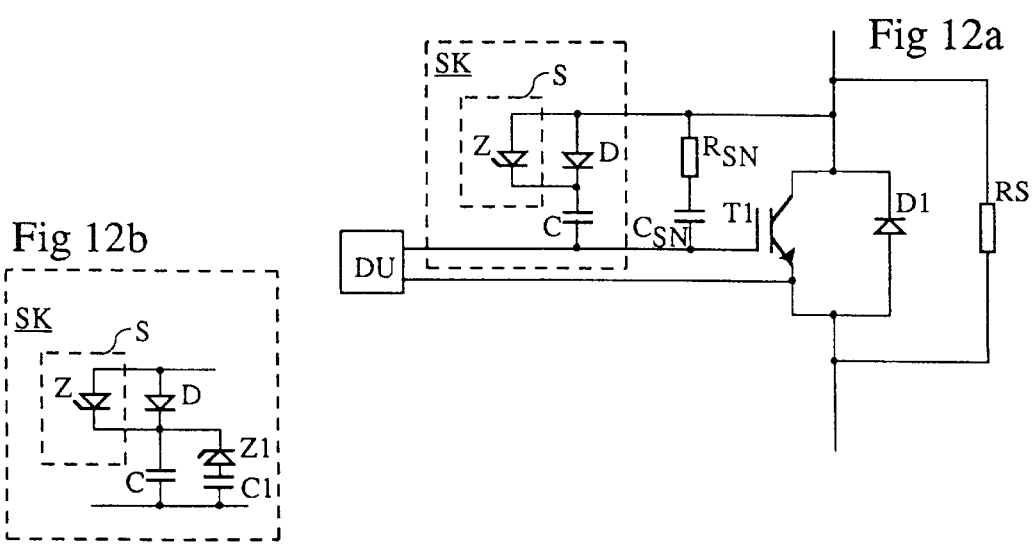
Fig 12a
Fig 12b

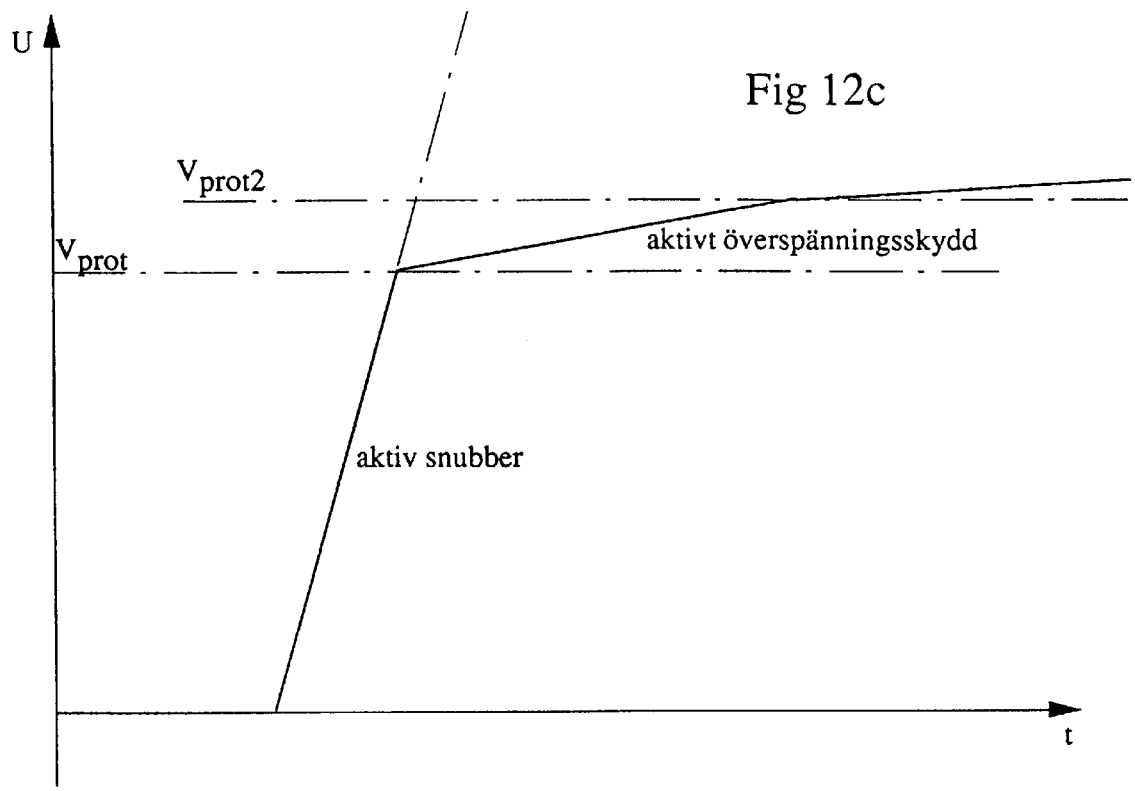
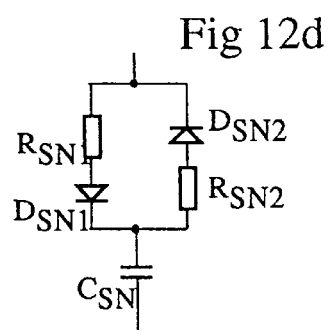
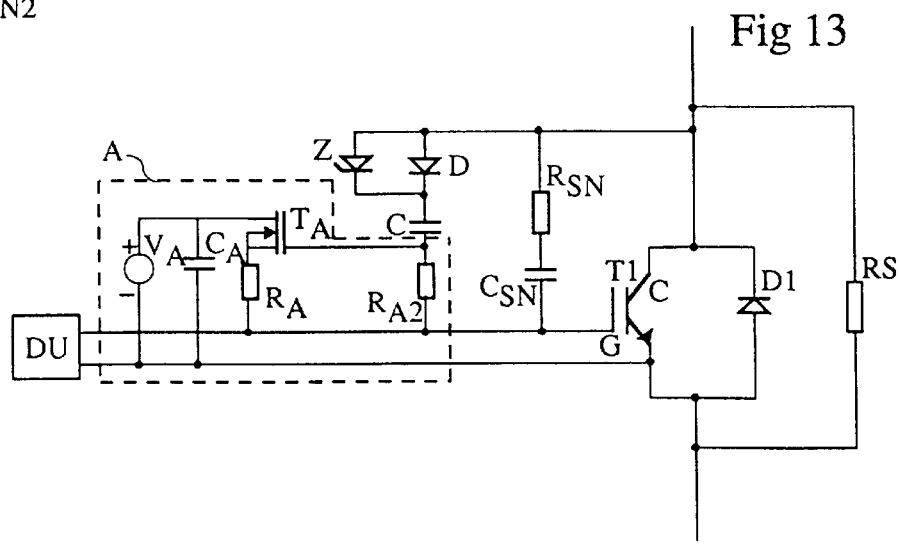

PROTECTIVE CIRCUIT FOR SERIES-CONNECTED POWER SEMICONDUCTORS

TECHNICAL FIELD

The present invention relates to an overvoltage protection device of transient protection type intended to reduce the risk of overvoltage across a power semiconductor, which among other things may occur in connection with turn-on and turn-off of the power semiconductor, when a plurality of such power semiconductors have been connected in series to build up a high voltage by voltage division.

BACKGROUND OF THE INVENTION

Self-commutated converters are used at present in a number of applications, for example in static converters for motor drives, switched supply devices, UPS systems, etc. Normally, in such applications, an individual power semiconductor is utilized for building up the occurring relatively high voltages. In certain applications, however, it is desired to switch off or on such a high voltage and this cannot be managed with a single power semiconductor. Power semiconductors then have to be capable of being series-connected with a good voltage division. As examples of applications in which it may be of interest to series-connect power components, it may be mentioned converters for high-voltage motors, traction motors or high-voltage generators. Further, there are applications within distribution and transmission of electric power wherein very high voltages (typically 20–500 kV) are switched on or off. High-voltage converters are used here, among other things as controlled rectifiers and inverters for transmission of high-voltage direct current (HVDC). It is considered that self-commutated converters of a voltage-source type will be used to an increasing extent in transmission and distribution applications. Besides in HVDC there may be mentioned, as examples, converters for reactive power compensation, phase angle control, improvement of the network quality (e.g. compensation of harmonics induced by non-linear loads), for transmission of power between the phases during a phase error, etc. In more general terms, these converters may be used to control power flows, provide better availability and higher network quality in existing AC systems.

In self-commutated converters there are used gate turn-off power semiconductors of GTO thyristor type or controllable power semiconductors of transistor type, for example IGBT, MOSFET, bipolar transistors (BJT), or Darlington transistors. In the higher power range, especially GTO thyristors and IGBT transistors, respectively, are at present the most interesting components. IGBT transistors are predicted to handle increasingly larger powers and successively to replace or supplement GTO thyristors in converters intended for high powers and high voltages.

In series connection of power semiconductors, which are in the form of components as IGBT or GTO, however, it is difficult to obtain a uniform voltage distribution between the components. This applies especially to turn-off of the current, but problems with voltage division may also arise during blocking and turn-on. For the IGBT case, a good voltage division is also required during a possible short circuit of a DC intermediate-link capacitor since the IGBT builds up voltage and limits the current. Taken together, these have contributed to the fact that the number of commercial applications using series-connected power components of the GTO or IGBT type is still very small.

The problems in connection with turn-off arise from the fact that the series-connected power components tend not to build up voltage completely synchronously. Certain components tend to turn off earlier than others, which easily causes overvoltages to arise for those components which turn off early in a valve, by valve being meant the chain of series-connected components.

Similar problems may also arise during turn-on of the power components. Certain components turn on later than others, which may lead to a brief overvoltage across the components which turn on later. However, the problems are normally smaller in the case of turn-on of the valve than in the case of its turn-off.

Further, during blocking of the valve, certain components may have a lower leakage current than others, which results in higher voltage across these components in a valve chain. However, this problem is normally relatively simple to over-come with a resistive voltage divider arranged in parallel with each power component in the chain.

During short-circuiting of the dc intermediate link capacitor, in the IGBT case, component variations will result in certain IGBTs starting to build up voltage at a lower current than others, which leads to an uneven division of the voltage and problems with overvoltages on certain components.

In forced-commutated converters of a voltage-source type, there is normally also an antiparallel diode in parallel with the turn-off power semiconductor (e.g. IGBT or GTO). This diode carries current in the opposite direction to the direction in which the turn-off power semiconductor carries current in the chain of series-connected power semiconductors (FIG. 1). When the mentioned diode turns off and builds up voltage, problems with voltage division may arise also in this case. The mentioned antiparallel diode constitutes a power semiconductor which must be protected against overvoltages caused by an uneven division of the voltage across the series-connected diodes in the chain. In this document, the concept of series-connected power semiconductors also comprises power semiconductors connected in parallel across the controllable and turn-off power semiconductors. Normally, however, the voltage division during turn-off of the power semiconductors (GTO, IGBT) is the case which is most difficult to handle.

In GTO applications (not series connection of power semiconductors), it is common to apply a so-called RCD snubber in parallel with the GTO. FIG. 2 shows an example of an RCD snubber, where DU designates a drive unit, T1 a GTO, D1 an antiparallel diode, and SN comprises the snubber. Such a snubber is intended to limit the speed of the voltage growth across the GTO, which increases the current handling capacity of the GTO and reduces the turn-off losses thereof. An RCD snubber also improves the voltage division during series connection of such components. To obtain a good voltage division, however, a capacitor included in the snubber must be large, which normally means that the snubber losses become too large to handle. SE patent 8801140-8 discloses a method in which, by introducing individual delays in the control-pulse generation, the voltage division may be improved without need to choose a very large snubber capacitor. The method is based on the temperature of an overvoltage protection device, in this case a varistor, being measured individually for each thyristor and on a signal, based on the measurement, being used to achieve an individual delay of the turn-off time of the thyristor.

In IGBT applications (not series connection), it is common to use simpler types of snubber devices or to exclude the snubber completely. The reason for this is that the IGBT can normally handle a faster voltage growth during turn-off than the GTO. However, it is often suitable to have some type of overvoltage protection device to limit the voltage peak which always occurs during commutation of a current in a circuit with a certain inductance (see, e.g. "Protection of IGBT Modules in Inverter Circuits", EPE Journal, Vol. 1, No. 1, July 1991). One example of such a protection device of the type mentioned, which is effective with respect to overvoltages, is a clamping capacitor which feeds back its charge to a dc intermediate link (FIG. 3). This type of snubber does not limit the voltage build-up across the IGBT until it has reached the value to which the clamping capacitor is charged. This results in the losses in the snubber to becoming very low while at the same time overvoltages in connection with turn-off are effectively limited.

During series connection of IGBTs, however, some type of overvoltage protection is needed, which prevents individual components, which turn off earlier than others, from building up too high a voltage. A natural choice for achieving a passive overvoltage protection device is then to use the same type of snubber as for GTO applications, namely, an RCD snubber. However, the losses in such an RCD snubber easily become relatively great since it is normally difficult to cause all the series-connected IGBTs to turn off at exactly the same time.

An overvoltage protection device may also be active. By an active overvoltage protection device it is meant that the protection device influences the control of the component such that it tends to increase its conductivity again if the voltage across the component rises too high. A natural choice to achieve an active overvoltage protection device for an IGBT is simply to connect a Zener diode in series with a diode between the collector and the gate (FIG. 4). This method is described, for example, in "Switching Voltage Transient Protection Schemes for High Current IGBT Modules", IEEE 1994. The disadvantages of this concept, according to the authors of the article, are that the stray capacitances in the protective components may influence the turn-off process negatively and that the protective method increases the turn-off losses during turn-off of normal currents.

Active protection devices also exist in other forms, for example, an active snubber. An active snubber comprises, for example, a capacitor and a resistance between the collector and the gate on an IGBT (FIG. 5) and the object thereof is to limit the voltage derivative during turn-on and turn-off, respectively. This technique is described, for example, in "An Investigation of the Drive Circuit Requirements for the Power Insulated Gate Bipolar Transistor (IGBT)", IEEE Trans on Power Electronics, Vol. 6, No. 2, April 1991.

SUMMARY OF THE INVENTION

The present invention relates to an overvoltage protection device of a transient protection type intended to reduce the risk of overvoltage across a power semiconductor in a chain of series-connected power semiconductors, wherein the overvoltage protection device comprises at least one capacitor and wherein the overvoltage protection device is activated when the voltage across the power semiconductor exceeds a definite voltage level ($V_{prot}$)

At each time when the protection device is activated, a current passes through the above-mentioned capacitor, the capacitor thus being charged. During a protective incident, the voltage across the power semiconductor rises above the voltage level $V_{prot}$. Approximately, the voltage across the power semiconductor $V_{CE}(t)=V_{prot}+Q(t)/C$, where Q(t) is the charge which passes through the capacitor with its capacitance C during the protective action. The task of the capacitor mentioned is to limit the voltage derivative $$\frac{dV_{CE}}{dt}$$

across the power semiconductor when the voltage across the power semiconductor exceeds the specified voltage level $V_{prot}$.

The invention makes possible a series connection of an arbitrary number of power semiconductors because the overvoltage protection device according to the invention limits a too high voltage growth across individual components in the chain.

The overvoltage protection device may, of course, be connected to protect a module comprising at least one power semiconductor component, wherein several modules are connected in series to build up any high voltage occurring in a valve chain.

The overvoltage protection device may be connected as a passive protection device or as an active protection device. There is also a possibility of combining the two types of protection devices to protect the sa me component or the same module.

Connected as a passive protection device, the device is connected in parallel across the power semiconductor or the power semiconductor module (FIG. 6). A power semiconductor which is included in the protected module may then be of an arbitrary type (e.g. IGBT, GTO, MCT, a diode, or a combination thereof). Connected as an active protection device, the device is connected between the collector and the gate /base of a controllable power semiconductor in a power semiconductor module (FIG. 7). The controllable power semiconductor may then only be of a transistor type (e.g. IGBT, MOSFET, BJT, or Darlington transistor).

Further, the overvoltage protection device comprises a diode which is series-connected to the capacitor and prevents the capacitor from being discharged completely during turn-on of a power semiconductor in a module when the module starts carrying current. A voltage controller the voltage level to which the capacitor is discharged after the activation of the overvoltage protection device.

The above-mentioned capacitor and protective diode in the overvoltage protection device are mutually connected in series. The protective diode is oriented to prevent discharge of the capacitor when the power semiconductor module is in the conducting state.

Usually, the voltage controller which controls the voltage across the capacitor is connected so that the capacitor, the voltage controller, and the power semiconductor module form a closed circuit (FIG. 8), which results in the voltage controller being only active when the power semiconductor module is turned on and the voltage across the power semiconductor module is low.

It is also possible to connect the voltage controller so that the capacitor and the mentioned controller form a closed circuit (FIG. 9), which results in the voltage controller being active independently of the state of the power semiconductor module.

In the following, the term power semiconductor will also be used for designating a power semiconductor module, whereby individual power semiconductors comprised in the module are denoted by the term components.

The advantage of a series connection of power semiconductors, in which each individual power semiconductor is protected by an overvoltage protection device according to the invention, is primarily a reduced risk of overvoltage across an individual power semiconductor device during turn-on and turn-off of a component in the module, and during a short-circuit process. This means that the requirements for synchronation, above all during turn-off (but also during turn-on), become lower and more reasonable. The requirements that all the power semiconductors behave largely identically during turn-off, turn-on and short-circuiting therefore also become more moderate, which, among other things, reduces the requirements for component control. In addition, greater differences in the respective drive circuits can be accepted. Otherwise, there could be a risk of having to select components which behave largely identically and trimming drive circuits, respectively. This may be difficult in an industrial application, where, in addition, after some time in use, it may be necessary to replace defective components or drive circuits.

The advantage of the passive overvoltage protection device of the invention compared with a conventional RCD snubber according to FIG. 2 may be summarized as follows:
the snubber losses are much lower for the same value of the capacitor C, since C does not have to be completely discharged.

The advantage of the active overvoltage protection device of the invention compared with a conventional active protection device comprising a Zener diode in series with a diode connected between the collector and the gate (FIG. 4) can be summarized as follows:
the overvoltage protection device according to the invention is short-circuit proof, that is, a fault in a Zener diode cannot lead to short circuit of the IGBT,
the IGBT can be utilized, from the dc point of view, to its full voltage since the protection device only limits the voltage derivative to a lower level,
during the protective action, the current need not pass through high-voltage Zener diodes or transient protective diodes, which increases the reliability. In addition, in these components, such problems as series resistance and stray capacitance, which have a negative influence on the protective function, are dispensed with,
combined with a current amplifier, the stresses in the protective components may be further reduced. The physical size of the protection device can then be additionally reduced,
combined with an active snubber, a fast response of the power semiconductor is obtained when the level of protection is passed.

The advantage of the combined passive and active overvoltage protection device of the invention, compared with an active protection device only, can further be summarized in that by the introduction of several levels of protection, the passive protection device in a valve may, for example, take care of differences in tail current of high-voltage IGBTs and rapidly reduce the voltage to a lower level after a protective action, which improves the voltage division in the valve immediately after a turn-off.

BRIEF DESCRIPTION OF THE DRAWINGS

FIG. 11 shows typical current and voltage waveforms across two series-connected power semiconductors during a turn-off process, wherein the overvoltage protection device according to the invention is connected as an active protection device.

FIG. 12a shows an active overvoltage protection device according to the invention combined with an active snubber.

FIG. 12b shows a modification of an overvoltage protection device with two voltage controllers.

FIG. 12c shows the level of protection of both the active snubber and the active overvoltage protection device. The overvoltage protection device can be given two levels of protection according to the invention.

FIG. 12d shows a resistance in a snubber in an active overvoltage protection device, wherein the snubber resistance changes depending on the current direction through the snubber.

FIG. 13 shows an active overvoltage protection device according to the invention, wherein the current signal is amplified in a transistor.

DETAILED DESCRIPTION OF THE PREFERRED EMBODIMENTS

Figure 1:
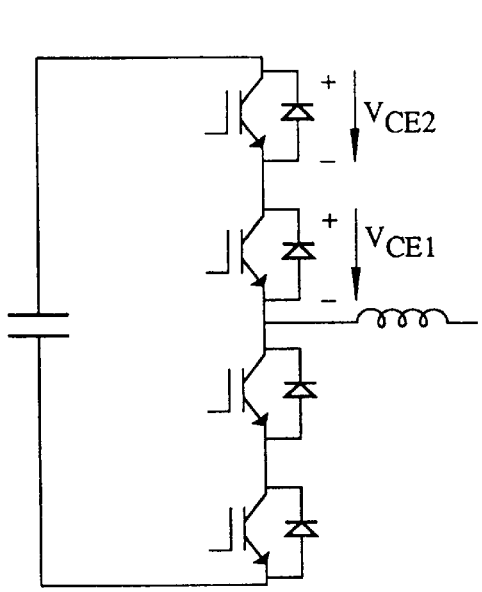
FIG. 1 shows a chain of conventional series-connected power semiconductor modules comprising antiparallel diodes across a controllable or turn-off power semiconductor device.
Figure 2:
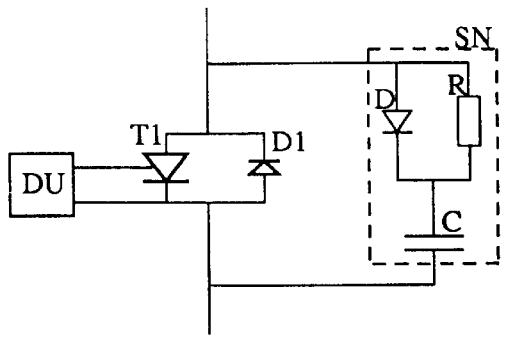
FIG. 2 illustrates a conventional snubber, which is used, for example, in GTO applications, a so-called RCD snubber.
Figure 3:
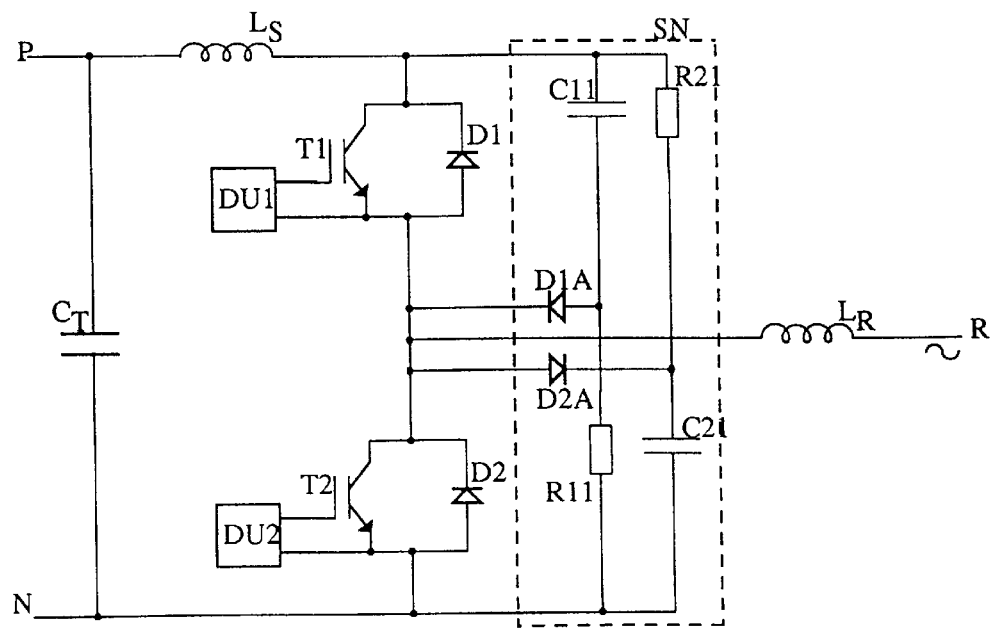
FIG. 3 shows a conventional feedback snubber of clamping type, used to prevent overvoltages during turn-off of an IGBT.
Figure 4:
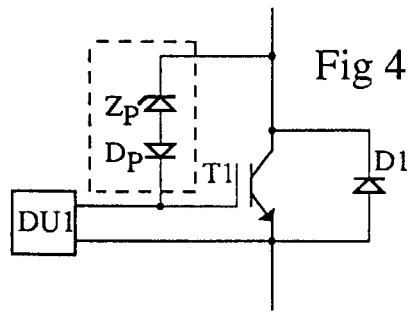
FIG. 4 shows a possibility of an active overvoltage protection device for an IGBT.
Figure 5:
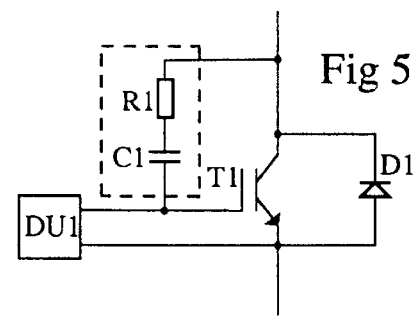
FIG. 5 shows a so-called active snubber for an IGBT.
Figure 1A:
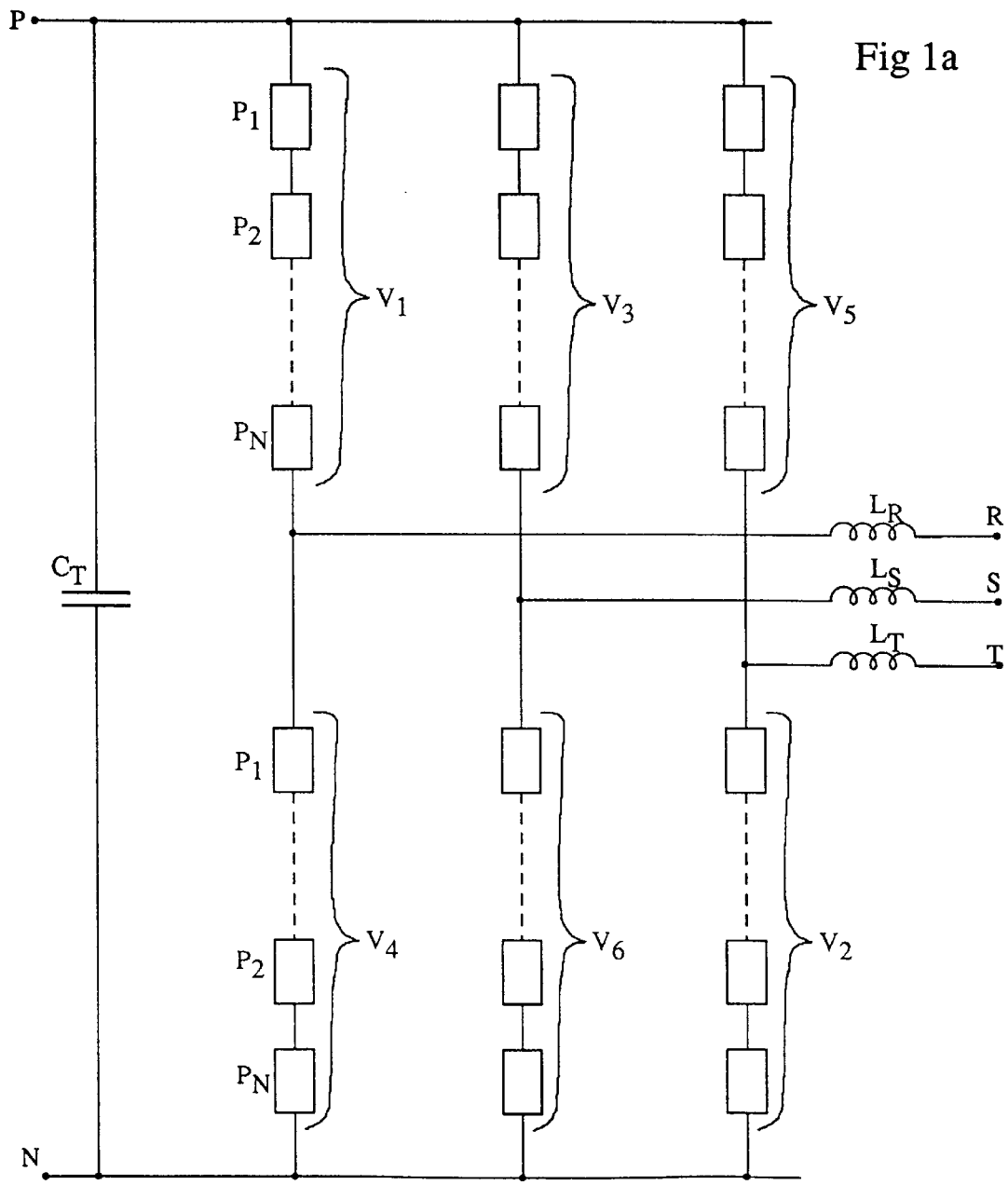
FIG. 1a illustrates a converter with six valve branches as an example of a field of use where an overvoltage protection device according to the invention is utilized during series connection of power semiconductors in the respective position
Figure 1B:
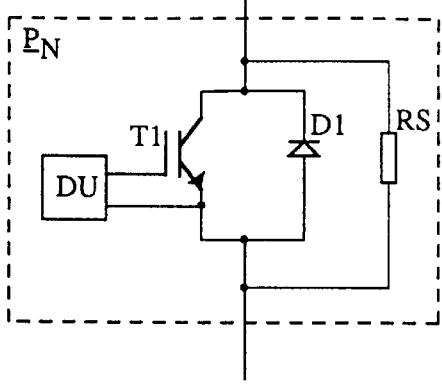
FIG. 1b shows a position $P_N$ which comprises a power semiconductor module which is intended to be protected by means of an overvoltage protection device according to the invention.

The invention will be described in the following with reference to a number of embodiments of the invention. As one example of a field of use of the invention there is schematically shown a converter according to FIG. 1a, a so-called six-pulse bridge with six valve branches $V_1-V_6$, wherein each valve comprises a chain of series-connected power semiconductors. In this case the converter is a voltage-source, self-commutated three-phase converter. The bridge is to be connected to a three-phase alternating-voltage network at points R, S, T via the inductors $L_R$, $L_S$, $L_T$ and the dc terminals P and N, which are connected to a capacitor $C_T$. According to the above, each individual valve branch $V_i$ comprises an arbitrary number of positions $P_1, \ldots, P_N$, and each position comprises a power semiconductor module with at least one power semiconductor component T1 which is to be protected with an overvoltage protection device SK according to the invention. FIG. 1b shows a position $P_N$, which in this case comprises a power semiconductor module made up of an IGBT component T1 together with an antiparallel diode D1, which constitute power semiconductors to be protected against overvoltages. The IGBT is controlled by a drive circuit DU connected between the gate and the emitter of the IGBT. In parallel across the IGBT and the antiparallel diode, respectively, there is also connected a resistance $R_S$, which serves as a voltage divider when the valve is in the blocked state.

Figure 7:
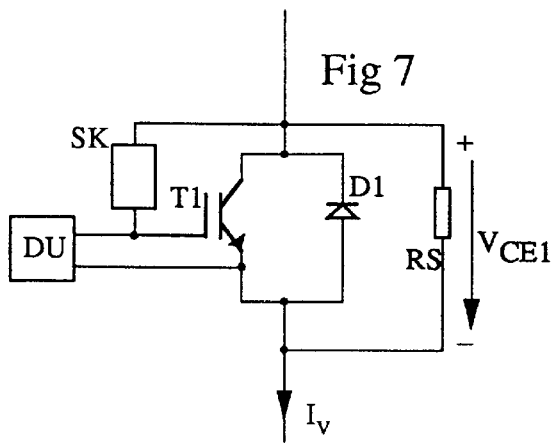
FIG. 7 shows the overvoltage protection device of transient protection type according to the invention, connected as an active protection device.
Figure 6:
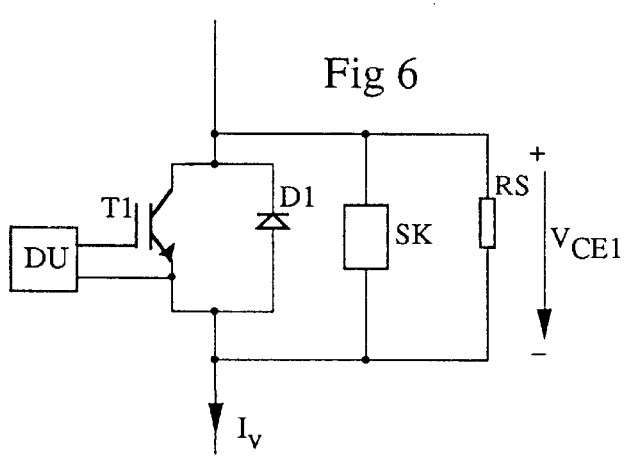
FIG. 6 shows the overvoltage protection device of transient protection type according to the invention, connected as a passive protection device.

To protect each individual power semiconductor module and hence individual power semiconductor components T1, T2, . . . and D1, D2, . . . , respectively, in the series of modules against overvoltage which may occur in connection with nonsynchronous turn-on or turn-off of the power semiconductors in the series and hence give rise to impermissible voltage levels across any of the power semiconductor modules in the series, each power semiconductor is equipped with an overvoltage protection device SK according to FIG. 6. In FIG. 6, the protection device is connected as a passive protection device and is connected to the collector and emitter, respectively, of an IGBT. The protection device may also be connected as an active protection device, whereby the protection device, for example is connected between the collector and the gate, respectively, of the IGBT. This is shown in FIG. 7.

Figure 8:
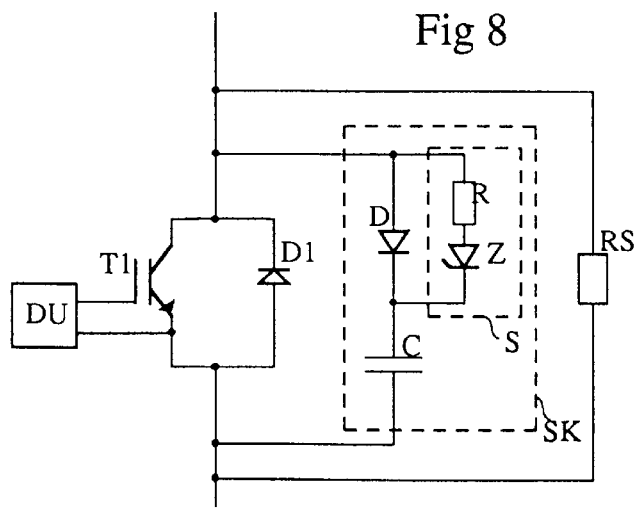
FIG. 8 shows the overvoltage protection device according to the invention connected as a passive protection device, wherein the voltage controller is connected such that the capacitor, the voltage controller and the power semiconductor form a closed circuit.

The overvoltage protection device SK may be configured in several different ways. Common to all the variants is that the protection device comprises a charged capacitor C and a protective diode D, which according to FIG. 8 are disposed in series with each other. The protective diode D is oriented that it prevents discharge of the capacitor C when the power semiconductor T1 is in its conducting state. The capacitor C is normally always kept charged by a current which periodically flows through the diode D. If during turn-off of the chain of power semiconductors, one power semiconductor T1 turns off earlier than the others in the same chain, the overvoltage which briefly occurs across the power semiconductor will force current through the diode D and hence charge the capacitor C, which thereby protects the associated power semiconductor module comprising the components T1 and D1 from being subjected to overvoltage. During turn-on of the series, on the other hand, there is a risk that a power semiconductor T1 turns on somewhat later than the others, whereby this power semiconductor T1 runs the risk of being exposed to overvoltage for a brief period of time. Also in this case, current is carried through the diode D and charges the capacitor C, whereby the risk of overvoltage across the associated power semiconductor module is minimized.

The task of the diode D, which lies in series with the capacitor C, is to prevent a capacitor C from being completely discharged during turn-on of the associated power semiconductor T1. A voltage controller S makes the determination to which voltage level the capacitor is discharged after the activation of the overvoltage protection device SK.

Usually, the voltage controller S, which controls the voltage across the capacitor according to FIG. 8, is connected such that the capacitor C, the voltage controller S and the power semiconductor T1 form a closed circuit, which means that the voltage controller is only active when the power semiconductor turns on and the voltage across the power semiconductor is low. This connection is normally preferred. From the dc point of view, the power semiconductor can then be utilized to its highest voltage level, independently of the voltage where the voltage controller starts operating. In addition, a fault in the voltage controller S cannot lead to the power semiconductor being short-circuited, which is a very important property in a protection device intended for series-connected components designed for high voltages. The current in the loop which comprises the voltage controller S can be limited by a resistor R in the loop.

Figure 9:
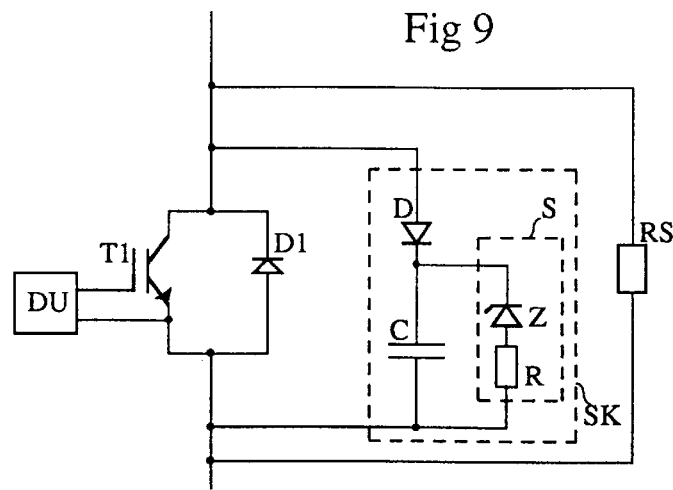
FIG. 9 shows the overvoltage protection device according to the invention connected as a passive protection device, wherein the voltage controller is connected such that the capacitor and the voltage controller form a closed circuit.

It is also possible to connect the voltage controller S according to FIG. 9 such that the capacitor C and the controller form a closed circuit, which means that the voltage controller is active independently of the state of the power semiconductor T1. This has the advantage that the controller can be realized with components with a low current-handling capacity. Also in this case, the voltage controller S may comprise a series resistor R.

In an additional modification of the invention, the voltage controller S is active only under the influence of an external control signal or, inversely, the voltage controller can be deactivated under the influence of an external control signal.

In one modification of the voltage controller S, the controller S comprises a semiconductor component Z which comprises a P-N junction with Zener characteristic (FIG. 8, FIG. 9), wherein the resistance of the semiconductor device is reduced at the voltage where the voltage controller S is activated. Such diodes Z are normally referred to as Zener diodes or transient protective diodes.

If the voltage controller S is to handle large average powers, it may be advantageous to provide the voltage controller with high-voltage transistors, as for example MOSFET or IGBT, driven in the linear range. Zener diodes may then be used to control at which voltage the transistor is to start conducting and controlling the voltage.

Figure 10:
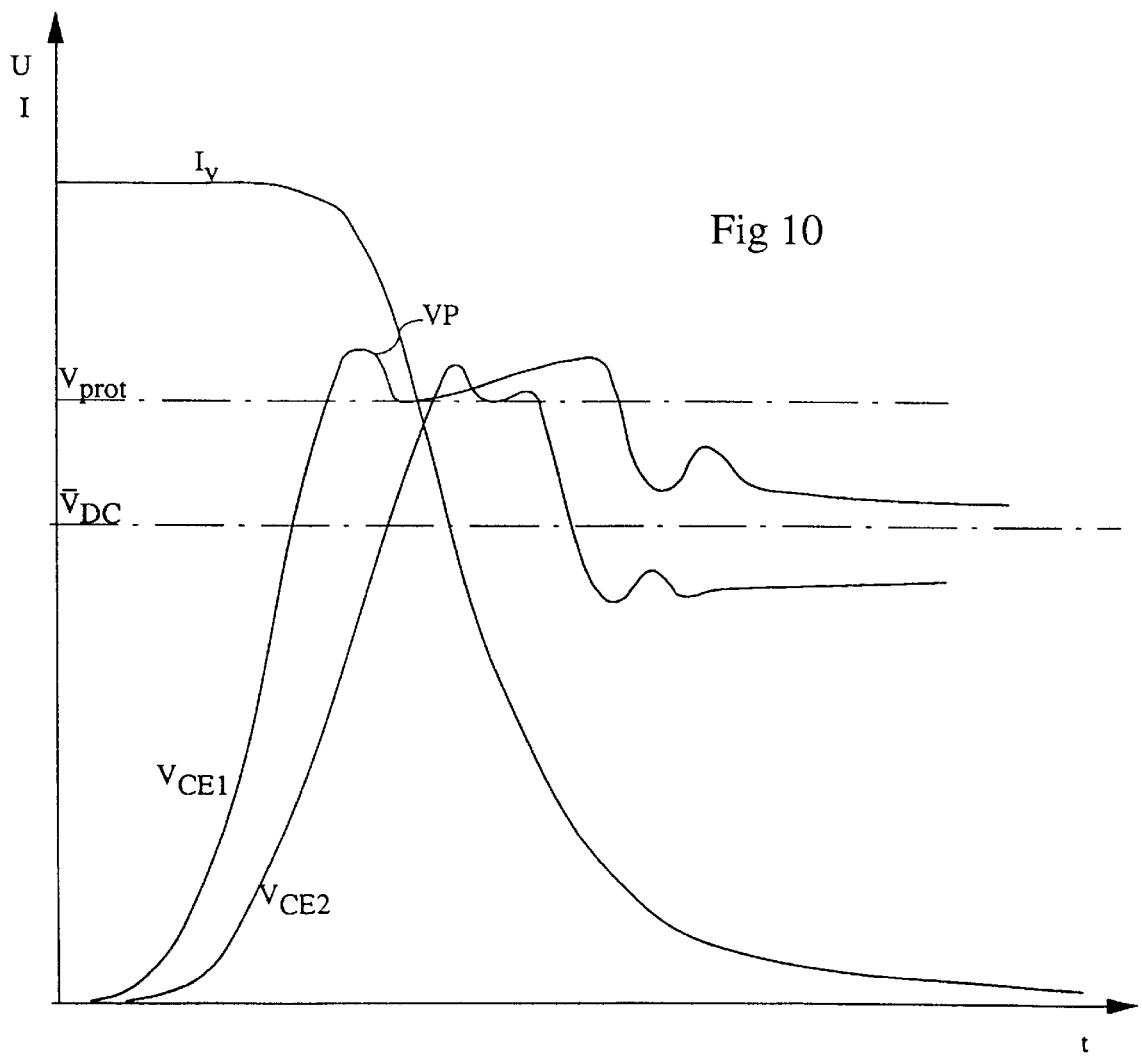
FIG. 10 shows typical current and voltage waveforms across two series-connected components during a turn-off process, wherein the overvoltage protection device according to the invention is connected as a passive protection device.

Connected as a passive protection device, during turn-off of the power semiconductor T1, the main part of the current through the power semiconductor will normally over to the capacitor C, in case the voltage exceeds the protective level $V_{prot}$. The voltage derivative across the power semiconductor is then reduced to a lower value. The voltage derivative is determined by the magnitude of the current which is commutated over and by the magnitude (FIG. 10). To prevent a large voltage overshoot VP from occurring when the current is commutated over to the capacitor, it is of the utmost importance that the current loop which is formed from the power semiconductor T1, the diode D, and the capacitor C have the lowest possible inductance. FIG. 10 shows current and voltage curves as functions of the time with the shown protective level $V_{prot}$ and mean level of the direct current $V_{DC}$ of the converter. The voltage across the respective semiconductor module is designated $V_{CE1}$ and $V_{CE2}$ (FIG. 1).

With the overvoltage protection device SK connected as an active protection device, normally only a fraction of the current through the power semiconductor T1 will commutate over to the capacitor C. However, this current influences the gate such that the conductivity of the power semiconductor increases, which in turn leads to a reduction of the voltage derivative to a lower level. For an IGBT, this makes it possible to reduce the voltage derivative to a level which is relatively independent of the current through the IGBT as soon as the voltage has exceeded the protective level (FIG. 11).

To reduce the response time of the protection device SK, it may be suitable to combine the active protection device with an active snubber which comprises a capacitor $C_{SN}$ and a resistance $R_{SN}$ (FIGS. 12a 12c) and 16. The reason is that an active snubber limits the voltage derivative during both turn-on and turn-off, which means that the IGBT is in its controllable range when the protective level is passed, which causes the power semiconductor T1 to react rapidly to the protective signal. If it is desired to limit the voltage derivative in one way during a turn-on process and in another way during a turn-off process, the resistance $R_{SN}$ in the snubber in an active overvoltage protection device may be replaced by different parallel-connected resistances which, by means of diodes, provide different resistances for the $R_{SN}$ depending on the current direction through the snubber SN (FIG. 12d).

In a variant of an active overvoltage protection device, the protective circuit may be allowed to trip at two different protective levels, at the voltages $V_{prot1}$ and $V_{prot2}$, whereby the voltage derivative is reduced in two steps according to FIG. 12c. This may be realized, for example, as shown in FIG. 12b, by connecting a series-connected Zener diode Z1 and capacitor C1 in parallel with the capacitor C of the protective circuit.

Figure 16:
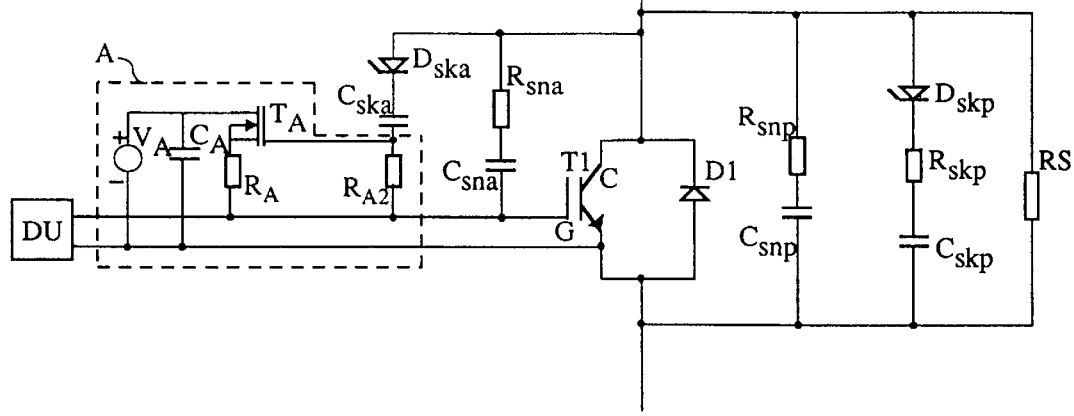
FIG. 16 shows an embodiment of a combined active and passive overvoltage protection device according to the invention.

To further reduce the need of current between the collector C and the gate G in an active protection device, amplification of the current signal may be introduced. This has the advantage that the influence of inductance on the circuit between the collector and the gate is reduced and the size of the components of capacitors and Zener diodes is reduced. An example of an overvoltage protection device combined with a current amplifier A, includes a voltage source $V_A$, a capacitor $C_A$, a transistor $T_A$, and resistors $R_A$ and $R_{A2}$ is shown in FIGS. 13 and 16.

Figure 14:
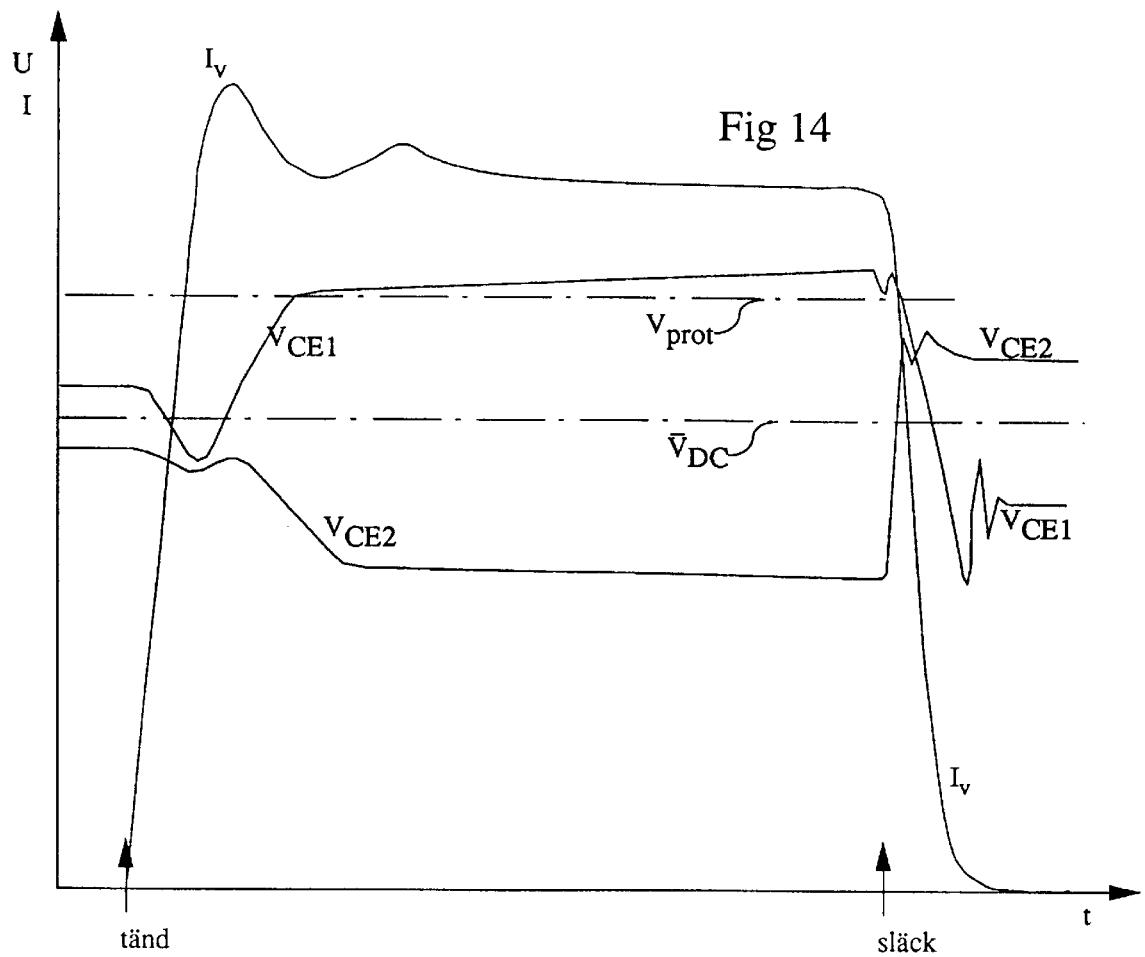
FIG. 14 shows typical current and voltage waveforms across two series-connected power semiconductors during a short-circuit process, wherein the overvoltage protection device according to the invention is connected as in FIG. 13.

An active protection device with current amplification is further of interest if it is desired that the protection device is to be activated for a longer period of time (e.g. 10 µs) without the voltage, because of this, rising to a level $V_{SOA}$ which is harmful to the component. Short-circuiting of the intermediate-link capacitor in a voltage-source converter is one such case where this type of overvoltage protection device is of interest to series-connected IGBTs. During such short-circuiting, the current rises very rapidly up to the level where the IGBTs themselves start building up voltage and limit the current. The current level at which the IGBTs start building up voltage may, however, vary from one component to another. This may be due to differences in the manufacture of the IGBTs (e.g. variation in threshold voltage) or other external factors such as variation in temperature or variation in driving voltage from the respective drive circuit. However, certain components tend to build up such a high voltage that the overvoltage protection device is activated. In this case, a certain time may elapse before the short circuit has been detected and acted upon, whereby the short-circuit protection device may need to be active for a comparatively long time, for example 10 µs (FIG. 14). This can be compared with a normal turn-off, where the protective action may be of the order of magnitude of 0.1–1 µs.

Figure 15:
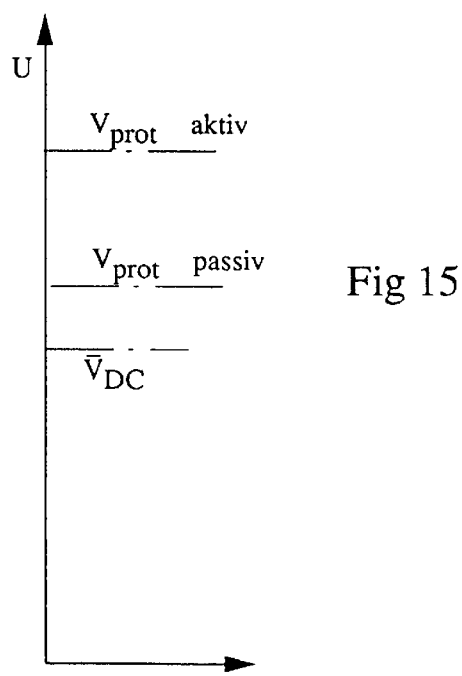
FIG. 15 shows different levels of protection for an overvoltage protection device according to the invention, connected as a combined active and passive protection device.

As mentioned previously, the protection device SK may also advantageously be connected as a combined active and passive protection device. In this case, the respective protection devices may be allowed to become active at different voltage levels. A suitable way is to allow the active protection device to become active at a higher voltage level than the passive (FIG. 15). To prevent the passive protection device from building up too large a proportion of the current at the initial stage (i.e. during the time when the active protection device is activated), a resistance $R_{SKP}$ may be introduced in the passive protection device in series with the diode $D_{SKP}$ and the capacitor $C_{SKP}$ (FIG. 16). Such a connection means (e.g. during turn-off of a high-voltage IGBT) that the active protection device may be allowed to protect the component against a too high transient voltage during that part of the turn-off process when the current is still high. When the current through the IGBT has dropped, the passive protection device may be activated and reduce the voltage across the component to another lower voltage level, determined by the protective level for the passive protection device. In the example in FIG. 16, the diode D of both the passive protection device (SK) and the active protection device (SK) and the voltage controller S have been combined and shown as one component $D_{skp}$ and $D_{ska}$, respectively, which, of course, is not necessary. A resistor $S_{SNP}$ and a capacitor $C_{SNP}$ are coupled in parallel with the Transistor T1.

Figure 17:
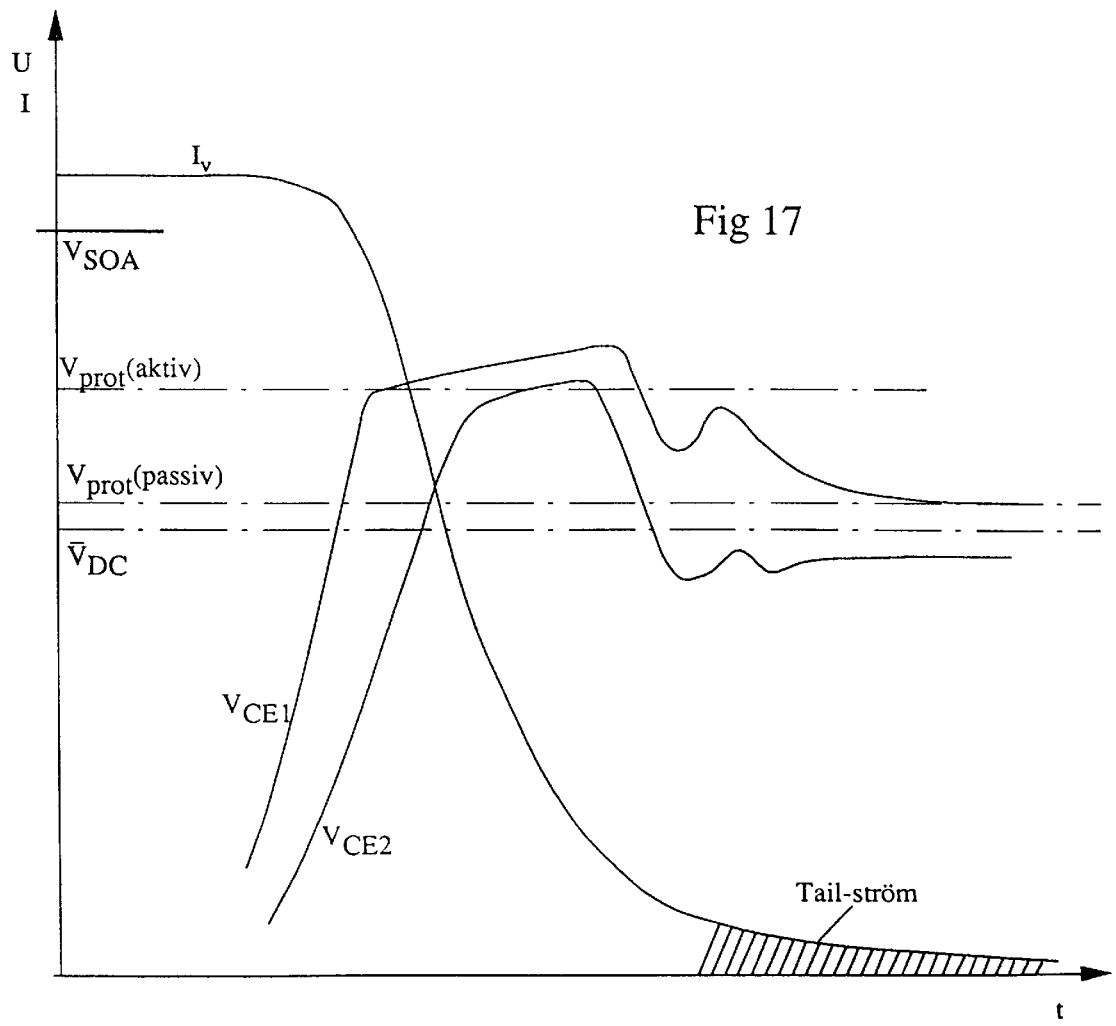
FIG. 17 shows typical current and voltage waveforms across two series-connected power semiconductors during a turn-off process, wherein the overvoltage protection device according to the invention is connected as in FIG. 16.

Normally, high-voltage IGBTs exhibit a considerable so-called tail current, which may be different from one component to another. The tail current is a relatively low current (normally only a few per cent of the operating current) which decays largely exponentially with the time. This tail current may, however, influence the voltage division between different components for a long time after turn-off. The passive protection device may then compensate for differences in tail current and reduce differences in voltage level caused by differences in these currents. This means that, soon after turn-off, the power semiconductor may be caused to resume a lower voltage level (FIG. 17), which may increase the service life of the power semiconductor T1. It has proved that power semiconductors which are subjected to high dc stresses for long spaces of time run an increased risk of breakdown.

Figure 18:
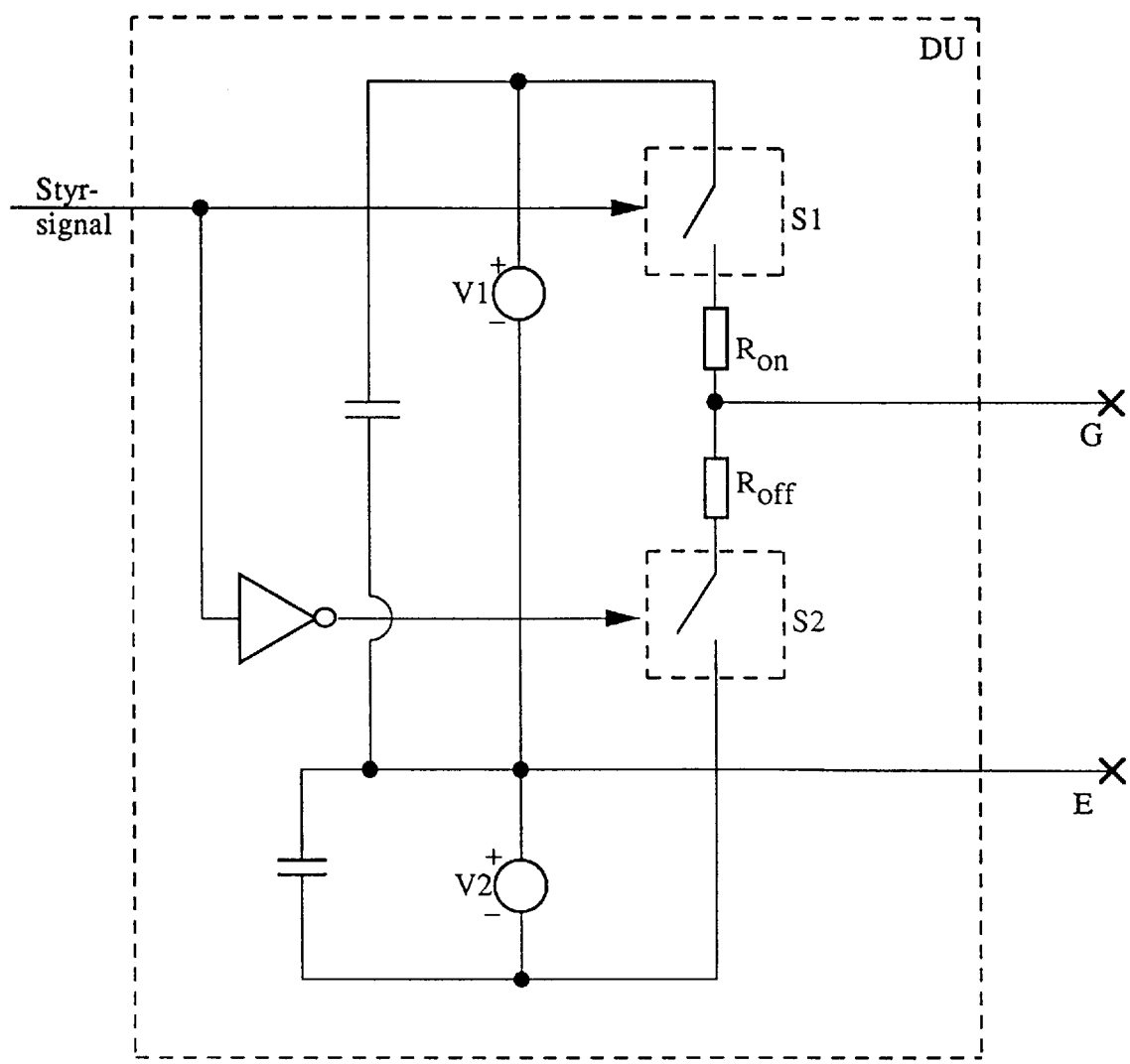
FIG. 18 shows an example of a drive unit for control of power semiconductors in a power semiconductor module.
Figure 19:
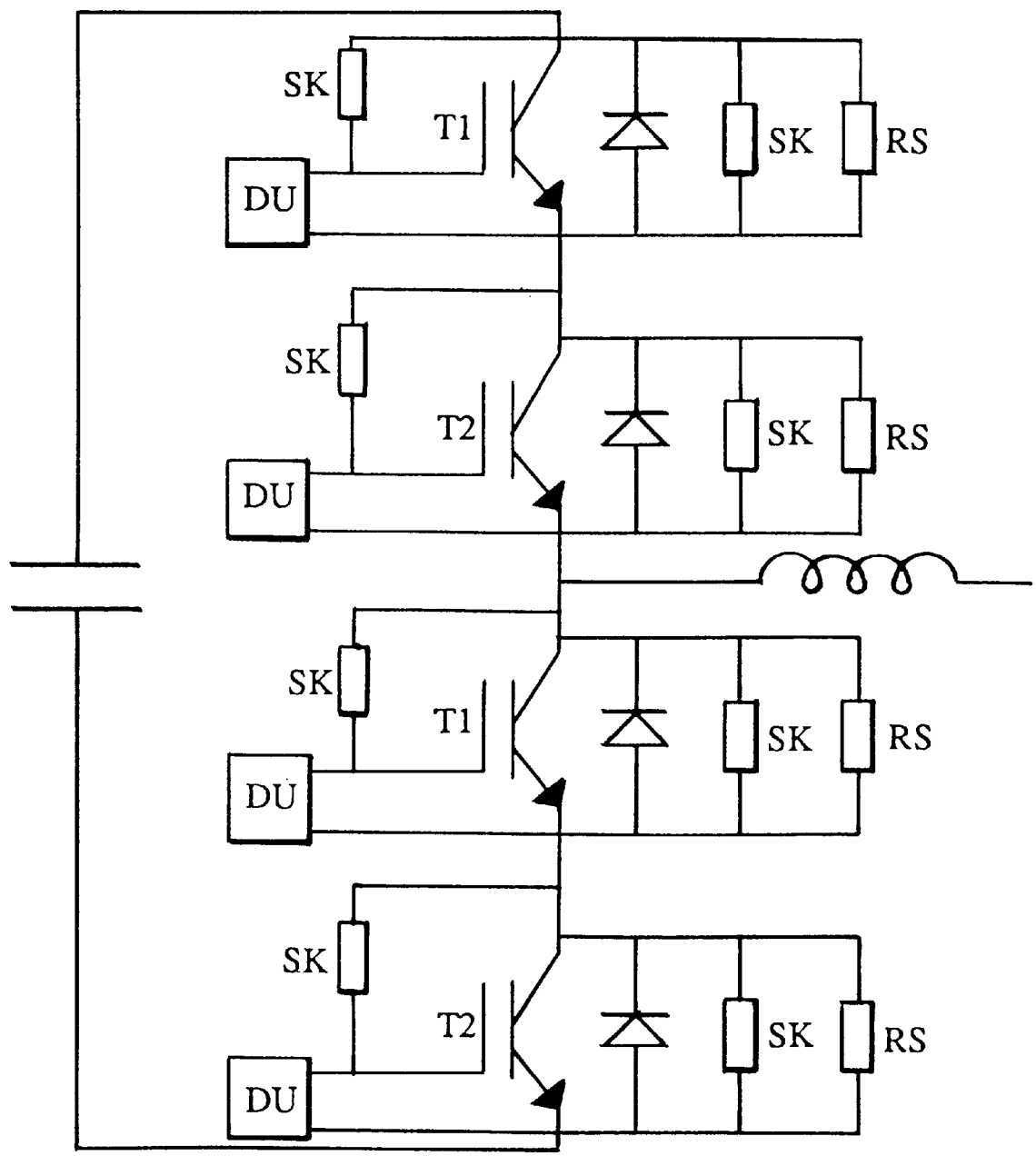
FIG. 19 shows series connected transistors with overvoltage protection devices according to the invention.
Figure 20:
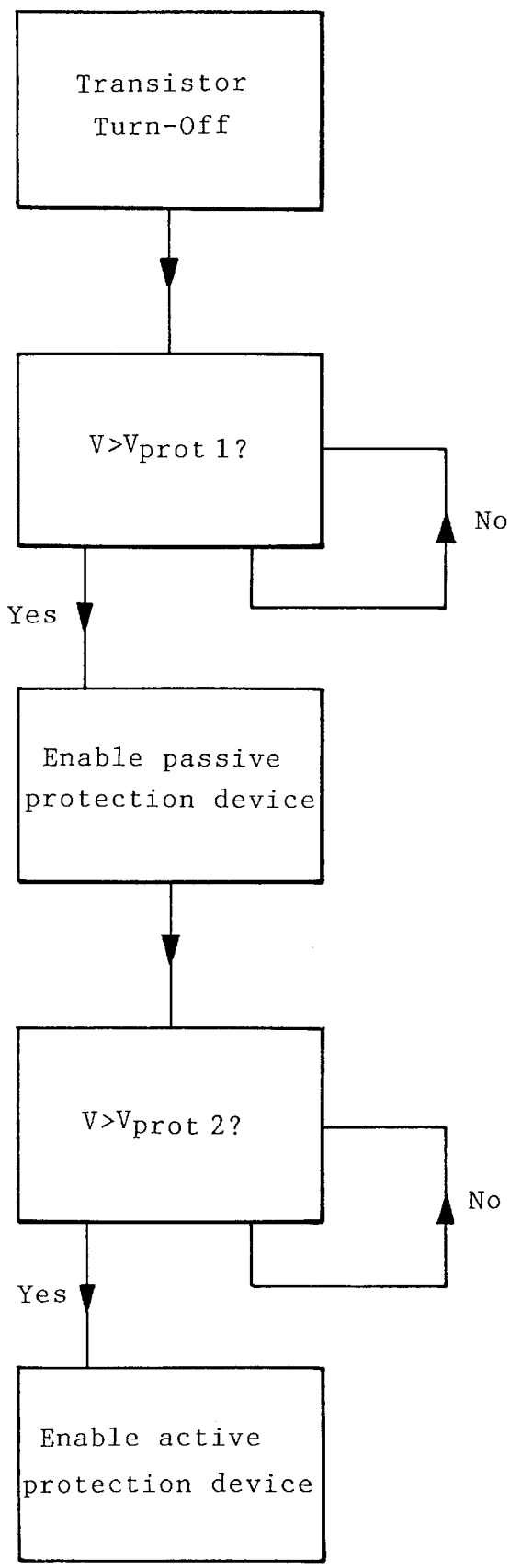
FIG. 20 is a block diagram of the function of the invention.

A drive unit according to the prior art is shown in FIG. 18, where the drive unit DU is used for controlling the power semiconductor T1 according to the different embodiments of the invention described above. The control signal to the drive unit controls two switches S1 and S2, respectively, which alternately open and close and thus give the signal at the output G such a potential with the aid of the voltage sources V1 and V2 that the controlled power semiconductor is set into a conducting or turned-off state.

I claim:

1. A semiconductor assembly comprising:

at least two series connected power semiconductors, each of said power semiconductors being protected by at least one overvoltage protection device, said overvoltage protection device being activated at a predetermined voltage and coupled in parallel across an emitter and collector of said power semiconductor, said overvoltage protection device comprising, a capacitor;

a rectifier connected in series with said capacitor and preventing said capacitor from discharging when said power semiconductor is in a conducting state; and a voltage controller connected in series into a closed circuit with said capacitor, said voltage controller determining the voltage level to which said capacitor is discharged after an activation of said overvoltage protection device.

2. A semiconductor assembly according to claim 1, wherein the capacitor, the voltage controller and the power semiconductor are connected in series into a closed circuit.

3. A semiconductor assembly according to claim 1 wherein said capacitor limits the voltage derivative $dV_{CE}/dt$ across the power semiconductor when the voltage across the power semiconductor exceeds the predetermined voltage level.

4. A semiconductor assembly according to claim 1 further comprising a snubber connected in parallel across the overvoltage protection device.

5. A semiconductor assembly according to claim 4, wherein said snubber comprises a capacitor and a resistor connected in series.

6. A semiconductor assembly according to claim 5, wherein the resistor comprises a closed circuit which comprises at least one resistor and at least one diode to impart different resistance to the resistor depending on the direction of the current through the snubber.

7. A semiconductor assembly according to claim 1 wherein the overvoltage protection device for the power semiconductor comprises both a passive protective circuit and an active protective circuit.

8. A semiconductor assembly according to claim 7, wherein the active protection device is activated at a higher voltage level than the passive protection device.

9. A semiconductor assembly according to claim 1 wherein the voltage controller is active only under the influence of an external control signal.

10. A semiconductor assembly according to claim 9 wherein the voltage controller comprises at least one semiconductor of transistor type which starts carrying current when the voltage controller is activated.

11. A semiconductor assembly according to claim 1 the voltage controller comprises at least one semiconductor device which comprises a p-n junction with Zener characteristics, wherein the resistance of the semiconductor device is reduced at the voltage level where the voltage controller is activated.

12. A semiconductor assembly according to claim 1, wherein the power semiconductors (T1, T2) are all controllable power transistors and of the type IGBT, MOSFET, BJT, or Darlington transistor.

13. A semiconductor assembly according to claim 1, wherein the power semiconductors are all gate turn-off thyristors and of the type GTO or MCT thyristor.

14. A semiconductor assembly according to claim 1, wherein the power semiconductor comprises a controllable power transistor or a gate turn-off thyristor and at least one rectifier connected in parallel across it.

15. A semiconductor assembly comprising:

at least two series connected controllable power semiconductors, each of said power semiconductors being protected by at least one overvoltage protection device, said overvoltage protection device being activated at a predetermined voltage and connected between a collector and a gate of said power semiconductor, said overvoltage protection device comprising, a capacitor;

a rectifier connected in series with said capacitor and which prevents said capacitor from discharging when said power semiconductor is in a conducting state; and a voltage controller connected to said capacitor and which determines the voltage level to which said capacitor is discharged after an activation of said overvoltage protection device.

16. A semiconductor assembly according to claim 15, wherein the overvoltage protection device for the power semiconductor comprises both a passive protective circuit and an active protective circuit.

17. A semiconductor assembly according to claim 15, wherein the power semiconductors are a controllable power transistor and comprise any of the types IGBT, MOSFET, BJT, or Darlington transistor.

18. A semiconductor assembly according to claim 15, wherein the power semiconductor is a gate turn-off thyristor and comprises any of the types GTO or MCT thyristor.

19. A semiconductor assembly according to claim 15, wherein the power semiconductor comprises a controllable power transistor or a gate turn-off thyristor and at least one rectifier connected in parallel across it.

20. A semiconductor assembly according to claim 15 wherein a current amplifier amplifies the current through the capacitor.

21. A semiconductor assembly according to claim 15 wherein the overvoltage protection device is activated in at least two steps at different protective levels.

* * * * *